(12) United States Patent
Dedic

(10) Patent No.: US 6,329,940 B1
(45) Date of Patent: Dec. 11, 2001

(54) CURRENT SWITCHING CIRCUITRY

(75) Inventor: Ian Juso Dedic, Northolt (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/634,588

(22) Filed: Aug. 8, 2000

(30) Foreign Application Priority Data

Nov. 10, 1999 (GB) .................................... 9926653

(51) Int. Cl.$^7$ .................................................. H03M 1/06
(52) U.S. Cl. ............................................... 341/144
(58) Field of Search ............................ 341/144, 118, 341/136, 150, 153

(56) References Cited

U.S. PATENT DOCUMENTS

| | | |
|---|---|---|
| 4,405,916 * | 9/1983 | Hornak .............................. 341/144 |
| 4,961,015 | 10/1990 | Shin et al. . |
| 5,194,866 | 3/1993 | Imaizumi et al. . |
| 5,369,402 | 11/1994 | Kwon . |
| 5,452,014 | 9/1995 | Manley . |
| 5,612,697 | 3/1997 | Mercer . |
| 5,689,257 | 11/1997 | Mercer et al. . |
| 5,696,512 | 12/1997 | Takiguchi . |
| 6,075,473 * | 6/2000 | Masuda ............................. 341/144 |

FOREIGN PATENT DOCUMENTS 2 333 191    7/1999  (GB) .

* cited by examiner

Primary Examiner—Brian Young
(74) Attorney, Agent, or Firm—Staas & Halsey LLP

(57) ABSTRACT

Current switching circuitry comprises a plurality of circuitry segments $SEG_1$ to $SEG_n$, each having first and second connection nodes (ON1, ON2) through which first and second controllable currents pass respectively when the circuitry is in use, and switching circuitry (S1, S2) for changing the respective magnitudes of the first and second controllable currents in dependence upon a switching signal (SW1, SW2) applied to the segment. The switching circuitry further comprises first combining circuitry, connected with the respective first connection nodes (ON1) of the segments and also connected operatively with a first combined signal terminal (OUTA), and second combining circuitry, connected with the respective second connection nodes (ON2) of the segments and also connected operatively with a second combined signal terminal (OUTB). The first and second combining circuitries are respectively for combining the first and second controllable currents of the segments to produce first and second combined signals ($V_A$, $V_B$) at the first and second combined signal terminals (OUTA, OUTB).

24 Claims, 10 Drawing Sheets

| BINARY INPUT WORD | | | THERMOMETER-CODED SIGNALS | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

Fig.2

CURRENT SWITCHING CIRCUITRY

BACKGROUND OF THE INVENTION

1. Field of the Invention

The present invention relates to current switching circuitry for use, for example, in digital-to-analog converters (DACs).

2. Description of the Related Art

FIG. 1 of the accompanying drawings shows parts of a conventional digital-to-analog converter (DAC) of the so-called "current-steering" type. The DAC 1 is designed to convert an m-bit digital input word (D1–Dm) into a corresponding analog output signal.

The DAC 1 includes a plurality (n) of identical current sources $2_1$ to $2_n$, where $n=2^m-1$. Each current source 2 passes a substantially constant current I. The DAC 1 further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by a binary-thermometer decoder 6. The decoder 6 operates as follows.

When the binary input word D1–Dm has the lowest value the thermometer-coded signals T1-Tn are such that each of the differential switching circuits $4_1$ to $4_n$ selects its second terminal so that all of the current sources $2_1$ to $2_n$ are connected to the second connection is line B. In this state, $V_A=0$ and $V_B=nIR$. The analog output signal $V_A-V_B=-nIR$.

As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n–i differential switching circuits $4_{i+1}$ to $4_n$ select their respective second terminals. The analog output signal $V_A-V_B$ is equal to $(2i-n)IR$.

FIG. 2 shows an example of the thermometer-coded signals generated for a three-bit binary input word D1–D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr-1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

FIG. 3 shows a previously-considered form of differential switching circuit suitable for use in a digital-to-analog-converter such as the FIG. 1 converter.

This differential switching circuit 4 comprises first and second PMOS field effect transistors (FETs) S1 and S2. The respective sources of the transistors S1 and S2 are connected to a common node CN to which a corresponding current source ($2_1$ to $2_n$ in FIG. 1) is connected. The respective drains of the transistors S1 and S2 are connected to respective first and second output nodes OUTA and OUTB of the circuit which correspond respectively to the first and second terminals of each of the FIG. 1 differential switching circuits.

Each transistor S1 and S2 has a corresponding driver circuit 61 or 62 connected to its gate. A corresponding one of the thermometer-coded signals T is applied to the input of the driver circuit $6_1$, whilst a signal $\overline{T}$ complementary to the signal T is applied to the input of the driver circuit $6_2$. Each driver circuit buffers and inverts its received input signal T or $\overline{T}$ to produce a switching signal SW1 or SW2 for its associated transistor S1 or S2 such that, in the steady-state condition, one of the transistors S1 and S2 is on and the other is off. For example, as indicated in FIG. 3 itself, when the input signal T has the high level (H) and the input signal $\overline{T}$ has the low level (L), the switching signal SW1 (gate drive voltage) for the transistor S1 is at the low level L, causing that transistor to be ON, whereas the switching signal SW2 (gate drive voltage) for the transistor S2 is at the high level H, causing that transistor to be OFF. Thus, in this condition, all of the input current flowing into the common node CN is passed to the output node OUTA and no current passes to the output node OUTB.

Referring back to FIG. 1, in the FIG. 1 DAC the voltages $V_A$ and $V_B$ of the first and second connection lines A and B of the DAC vary in use of the DAC according to the value of the binary input word D1–Dm. This means that the potentials of the output nodes OUTA and OUTB of the differential switching circuit 4 also vary in use of the DAC. The transistors S1 and S2 have an appreciable parasitic capacitance. These parasitic capacitances must be charged or discharged whenever the differential switching circuit is switched over. The amount of charge that is charged or discharged is then dependent upon the change in the output voltages $V_A$ and $V_B$ of the DAC from one code to the next, resulting in a switching delay at the DAC output that is dependent upon the DAC output voltage. If, for example, the DAC is used to synthesise a sinewave at a selected frequency (for example 100 MHz) the output-voltage-dependent delay manifests itself as pulse width modulation at the DAC output. In a high-speed precision DAC this degrades the first-order performance of the DAC significantly. Furthermore, another problem is that the output conductances of the transistors S1 and S2 at the instant of switch-over depend weakly on the actual output voltages $V_A$ and $V_B$ of the DAC. This also degrades the DAC performance in high-precision applications.

SUMMARY OF THE INVENTION

According to a first aspect of the present invention there is provided current switching circuitry comprising: a plurality of circuitry segments, each having first and second connection nodes through which first and second controllable currents pass respectively when the current switching circuitry is in use, and switch circuitry for changing the respective magnitudes of the first and second controllable currents in dependence upon a switching signal applied to the segment; a first combiner, connected with the respective first connection nodes of the segments and also connected operatively with a first combined signal terminal, for combining the respective first controllable currents of the segments to produce a first combined signal at said first combined signal terminal; a second combiner, connected with the respective second connection nodes of the segments and also connected operatively with a second combined signal terminal, for combining the respective second controllable currents of the segments to produce a second combined signal at said second combined signal terminal; a first shielding circuit, connected between said first combined signal terminal and said switch circuitry in one or more of said segments, for shielding the switch circuitry in the segment(s) concerned from variations in potential arising from variations in potential of that terminal; and a second shielding circuit, connected between said second combined signal terminal and said switch circuitry in said one or more segments, for shielding the switch circuitry in the segment(s) concerned from variations in potential arising from variations in potential of that terminal.

In such circuitry, signal dependent delay at the first and second combined signal terminals is reduced.

With current switching circuitry embodying the first aspect of the present invention, each said shielding circuit preferably has a shielding element for each of said one or more segments, with each said connection node being connected to said switch circuitry via such a shielding element. The or each shielding element preferably comprises a cascode transistor. The cascode transistor of at least one said shielding element can have a control terminal whose potential is maintained at a substantially constant value in use of the circuitry. The cascode transistor of at least one said shielding element can have a control terminal whose potential is adjusted in use of the circuitry so as to compensate for a change in potential difference between said control terminal and a current-path terminal of the transistor brought about by a change in magnitude of current flowing through the cascode transistor. In the case where the cascode transistor is a field-effect transistor, the current switching circuitry may further comprise saturation condition maintaining circuitry for adjusting a gate potential of the field-effect transistor in dependence upon a measure of drain-source saturation voltage of the transistor, so as to maintain the transistor in a saturated operating condition irrespective of variations in said drain-source saturation voltage.

According to a second aspect of the present invention there is provided digital-to-analog conversion circuitry comprising: a plurality of circuitry segments, each having first and second connection nodes through which first and second controllable currents pass respectively when the circuitry is in use, and switch circuitry for changing the respective magnitudes of the first and second controllable currents in dependence upon a switching signal applied to the segment; a first combiner, connected with the respective first connection nodes of the segments and also connected operatively with a first combined signal terminal, for combining the respective first controllable currents of the segments to produce a first combined signal at said first combined signal terminal; a second combiner, connected with the respective second connection nodes of the segments and also connected operatively with a second combined signal terminal, for combining the respective second controllable currents of the segments to produce a second combined signal at said second combined signal terminal; a first shielding circuit, connected between said first combined signal terminal and said switch circuitry in one or more of said segments, for shielding the switch circuitry in the segment(s) concerned from variations in potential arising from variations in potential of that terminal; a second shielding circuit, connected between said second combined signal terminal and said switch circuitry in said one or more segments, for shielding the switch circuitry in the segment(s) concerned from variations in potential arising from variations in potential of that terminal; and decoder circuitry connected for receiving a digital input signal to be converted into a corresponding analog output signal, and operable to derive from the received digital input signal a set of said switching signals for application respectively to said segments.

BRIEF DESCRIPTION OF THE DRAWINGS

FIG. 2, also discussed hereinbefore, shows a table for use in explaining how thermometer-coded control signals are derived from a binary input word in the FIG. 1 DAC;

DETAILED DESCRIPTION OF THE PREFERRED EMBODIMENTS

Figure 1:
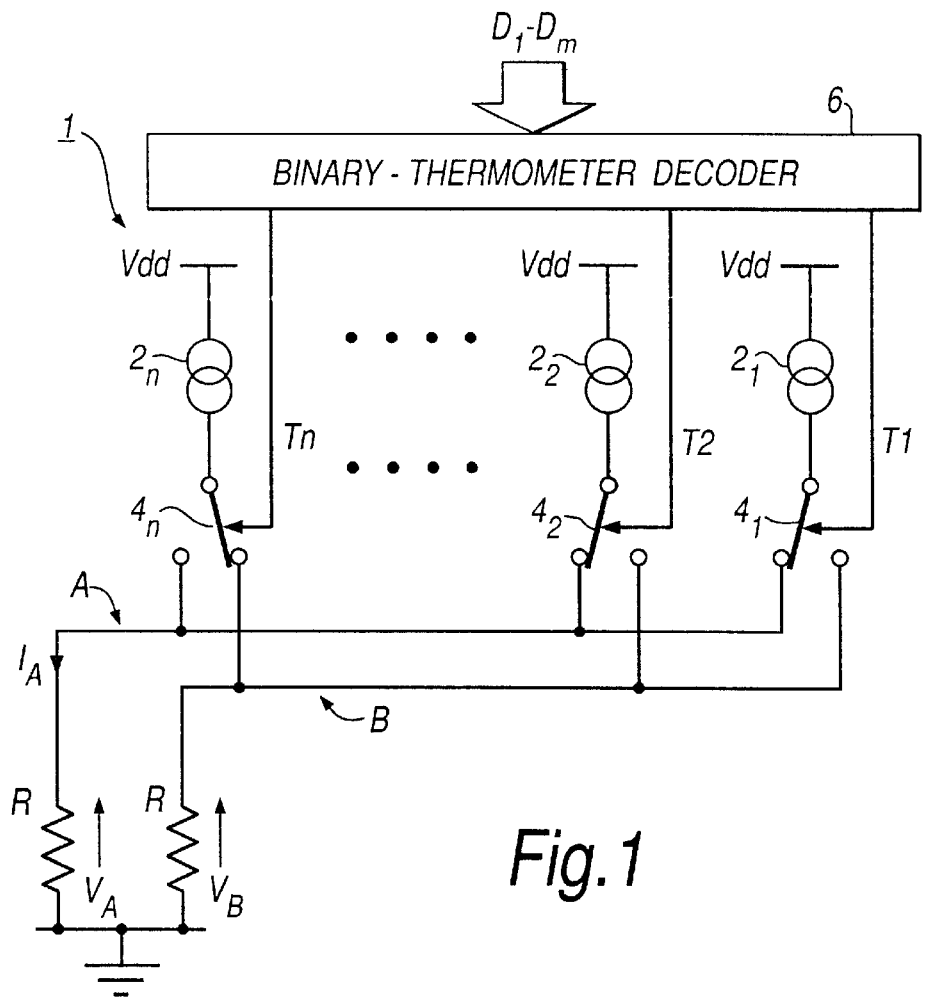
FIG. 1, discussed hereinbefore, shows parts of a previously-considered current-steering DAC.
Figure 3:
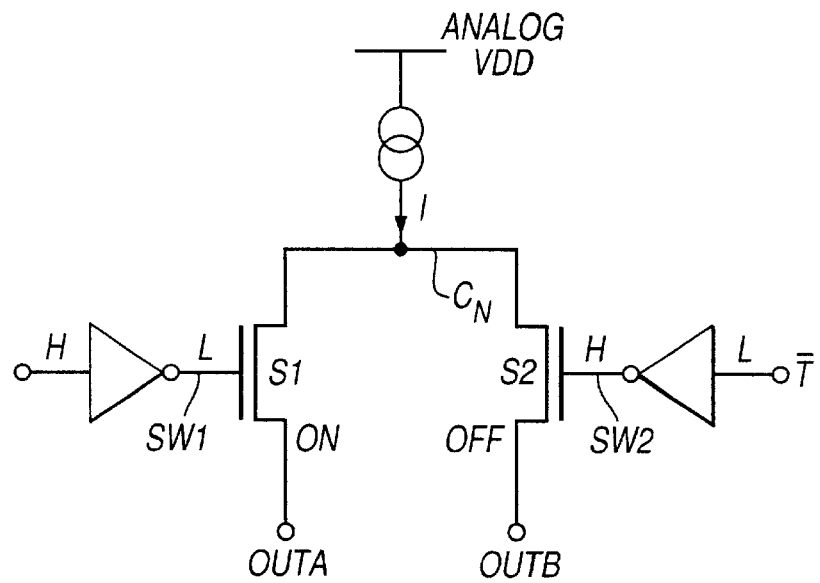
FIG. 3, also discussed hereinbefore, shows parts of a current switching circuit previously considered for use in a DAC.
Figure 4:
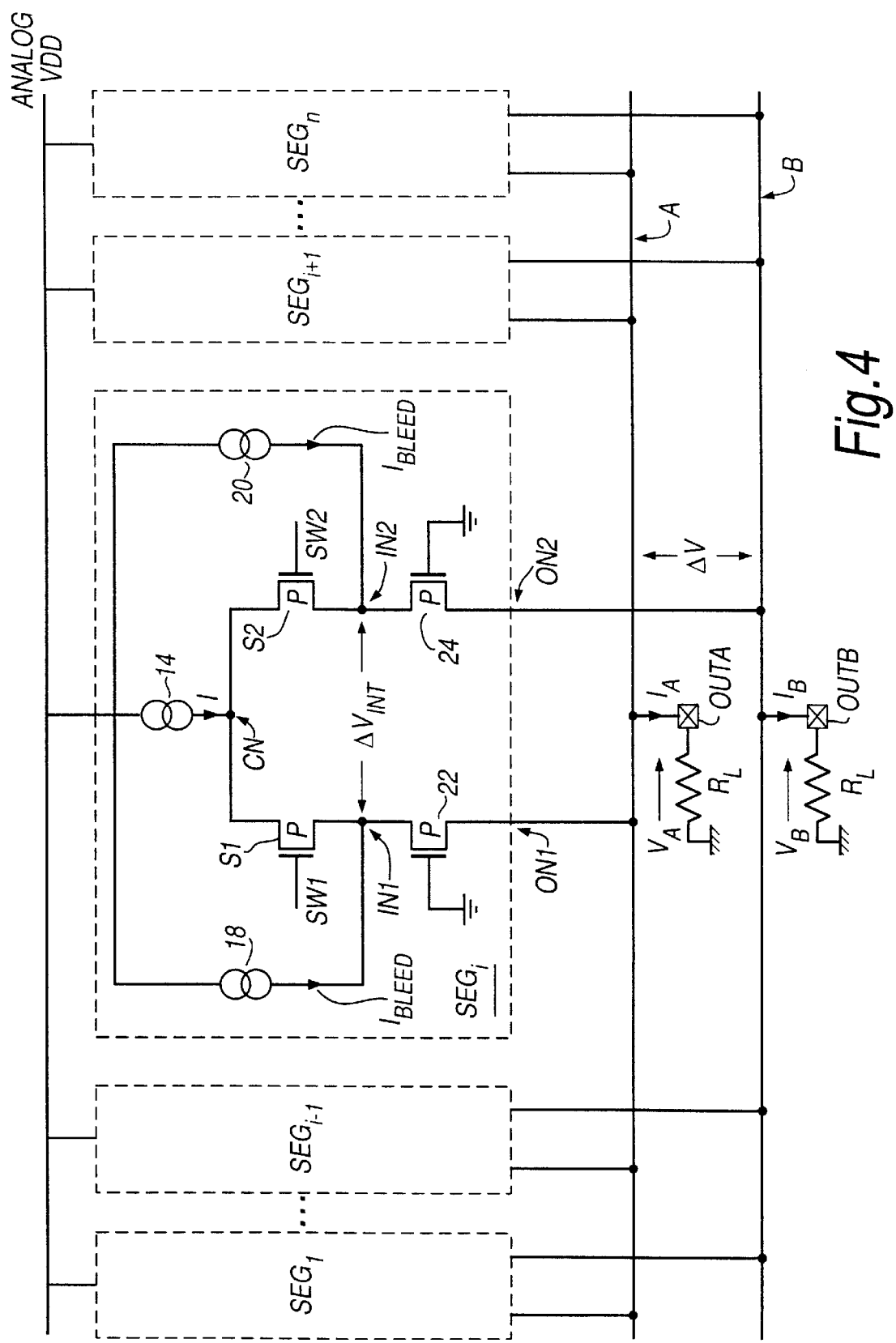
FIG. 4 shows parts of current switching circuitry according to a first embodiment of the present invention.

FIG. 4 shows parts of current switching circuitry 10 according to a first embodiment of the present invention. In FIG. 4, parts which are the same as, or correspond closely to, parts described previously with reference to FIGS. 1 to 3, are denoted by the same reference numerals, and an explanation thereof is omitted.

The FIG. 4 circuitry has a plurality of individual circuitry segments $SEG_1$ to $SEG_n$, only one of which $SEG_i$ is shown in detail in FIG. 4. Each segment has a first main switching transistor S1 having its source connected to a common node CN of the segment and its drain connected to a first intermediate node IN1 of the segment. Similarly, a second main switching transistor S2 has its source connected to the common node CN and its drain connected to a second intermediate node IN2 of the segment. Each main switching transistor is a PMOS FET in this embodiment. The switching transistors S1 and S2 receive respectively at their gates mutually-complementary switching signals SW1 and SW2 generated by driver circuits (not shown) such as the driver circuits $6_1$ and $6_2$ in FIG. 3.

Connected between the common node CN and a positive supply line ANALOG VDD of the circuitry is a constant-current source 14 which causes a substantially constant current I to be supplied from the positive supply line ANALOG VDD to the common node CN when the circuitry is in use.

Each of the intermediate nodes IN1 and IN2 is also connected to a bleed current source 18 or 20. Each bleed current source contains its own constant-current source which supplies a substantially constant current $I^{BLEED}$ from ANALOG VDD to the intermediate node which it is connected. The constant currents $I_{BLEED}$ supplied to the intermediate nodes IN1 and IN2 by the bleed current sources 18 and 20 may each be, for example, approximately one quarter of the current I supplied to the common node CN by the constant current source 16.

In the FIG. 4 circuitry, each individual segment SEG also has first and second output nodes ON1 and ON2. The respective first output nodes of all the segments $SEG_1$ to $SEG_n$ are connected in common to a first connection line A of the circuitry, and the respective second output nodes ON2 of all segments $SEG_1$ to $SEG_n$ are connected in common to a second connection line B of the circuitry. A first output terminal OUTA of the circuitry is connected to the first connection line A, and a second connection terminal OUTB of the circuitry is connected to the second connection line B.

Each segment of the circuitry also has respective first and second cascode transistors 22 and 24. Each cascode transistor is a PMOS FET. The first cascode transistor 22 has its source connected to the first intermediate node IN1, its drain connected to the first output node ON1 and its gate connected to a ground potential supply line GND of the circuitry. Similarly, the second cascode transistor 24 has its source connected to the second intermediate node IN2, its drain connected to the second output node IN2 and its gate connected to GND. Thus, in each segment there is a first branch between the common node CN and the first output node ON1, and a second branch between the common node CN and the second output node ON2.

Operation of the FIG. 4 circuitry will now be described.

In each segment, in the steady-state condition the main switching transistor S1 or S2 in one of the two branches is turned ON and the main switching transistor S2 or S1 in the other branch is turned OFF. Both cascode transistors 22 and 24 are permanently turned ON. The current I supplied to the common node CN of the segment is passed exclusively to the first output node ON1 if the ON switching transistor is the transistor S1, and is supplied exclusively to the second output node ON2 if the ON switching transistor is the transistor S2. The constant currents $I_{BLEED}$ supplied to each intermediate node IN1 and IN2 are also supplied via the cascode transistors 22 and 24 to the output nodes ON1 and ON2. The bleed currents $I_{BLEED}$ are supplied to the intermediate nodes IN1 and IN2 in order to ensure that, in the branch in which the switching transistor S1 or S2 is OFF, some current (i.e. the bleed current $I_{BLEED}$) continues to flow through the cascode transistor 22 or 24 of the branch concerned so as to maintain the cascode transistor in the ON condition.

The effect of the cascode transistors 22 and 24 is to shield each intermediate node IN1 and IN2 from variations in potential that would otherwise arise from variations in potential of the output terminals OUTA and OUTB. As described previously, the potential $V_A$ or $V_B$ of each output terminal OUTA or OUTB inevitably varies in use of the circuitry in accordance with an output current $I_A$ or $I_B$ flowing out of the output terminal concerned. There can be large changes in these output currents, and hence output voltages, from one cycle to the next. For example, if the binary input word changes from its full-scale negative value −FS to its full-scale positive value +FS the output current $I_A$ may change from, for example, 5 mA (its value when the switching transistors S1 in all segments are OFF) to 25 mA (its value when the switching transistors S1 in all the segments are ON), whilst at the same time the output current $I_B$ falls from 25 mA to 5 mA. Depending on the output load impedance associated with each output terminal, the change in potential $V_A$ or $V_B$ of each output terminal may be relatively large, for example 0.5V if each output load impedance is 25Ω. A difference ΔV between the output terminal potentials $V_A$ and $V_B$ changes by 1V in this case.

In the FIG. 4 circuitry, because of the shielding function provided by the cascode transistors 22 and 24 in each segment, a change $\Delta V_{INT}$ in potential difference between the respective potentials of the intermediate nodes IN1 and IN2 of each segment, in response to maximum changes in the output currents $I_A$ and $I_B$, is typically a factor of two or more lower in magnitude than the change in potential ΔV between the output terminals.

To understand the beneficial effect of the cascode transistors in embodiments of the present invention, a problem which occurs when the cascode transistors are not present (as in the previously-considered circuitry of FIG. 3) will be described in detail.

Figure 5A:
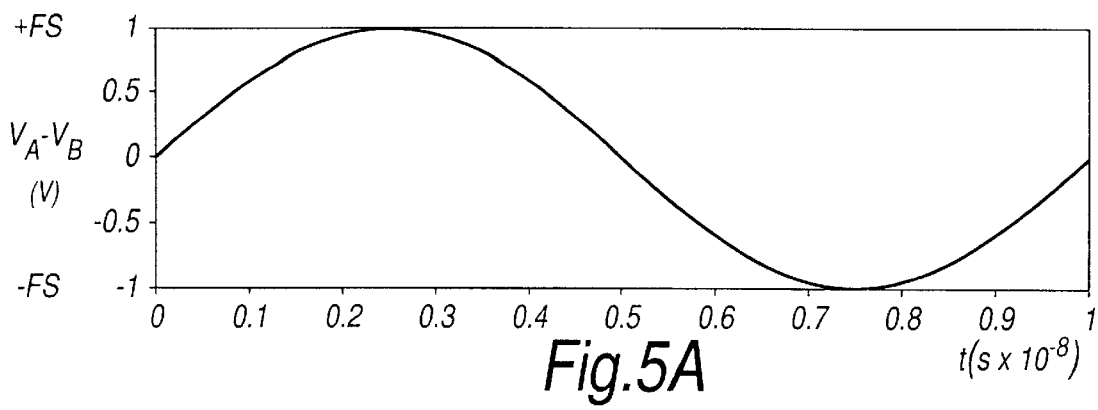
FIGS. 5(A) to 5(D) show operating waveforms generated by the FIG. 4 circuitry.

FIG. 5(A) shows an example waveform $V_A-V_B$ to be produced at the output of the circuitry. The waveform in this case is a sinewave having a frequency f of, for example, 100 MHz and a maximum amplitude of +FS and a minimum amplitude of −FS.

Figure 5B:
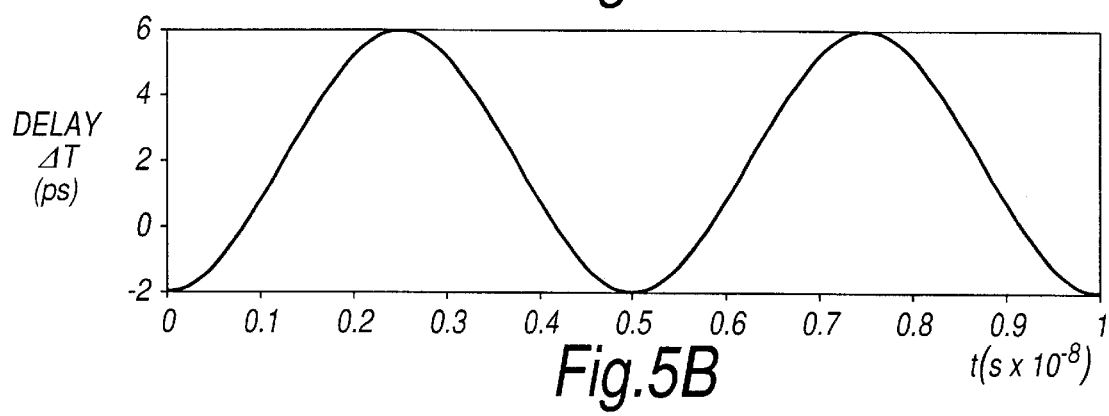

As indicated in the introductory portion of the present specification, when no cascode transistors are employed the segments have switching delays that are dependent on the output voltage. The delay Δt varies approximately as a function of the square of the output voltage, i.e. at a frequency of 2f, as shown in FIG. 5(B). The result is that the peaks of the FIG. 5(A) waveform are delayed by approximately 8 ps relative to the zero-amplitude points. The delays in FIG. 5(B) are all measured relative to a reference value which, in this example, is set so that the minimum delay is −2 ps and the maximum delay is +6 ps.

Figure 5C:
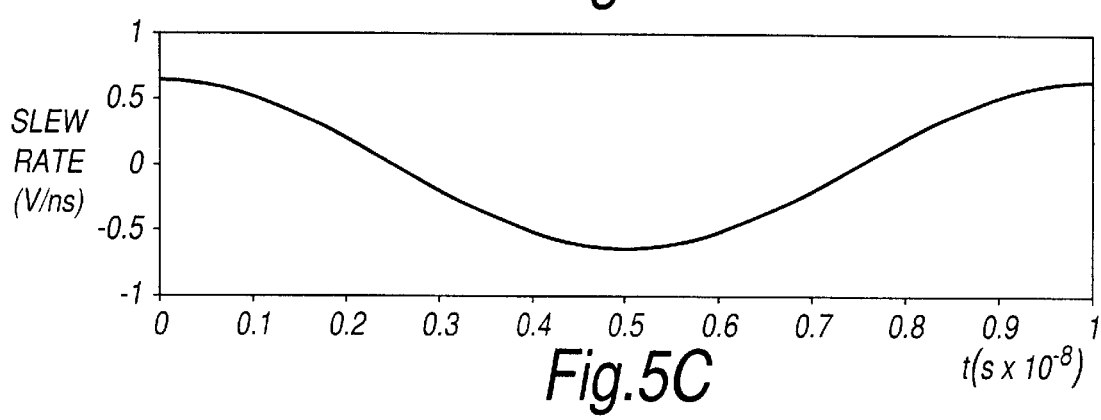
Figure 5D:
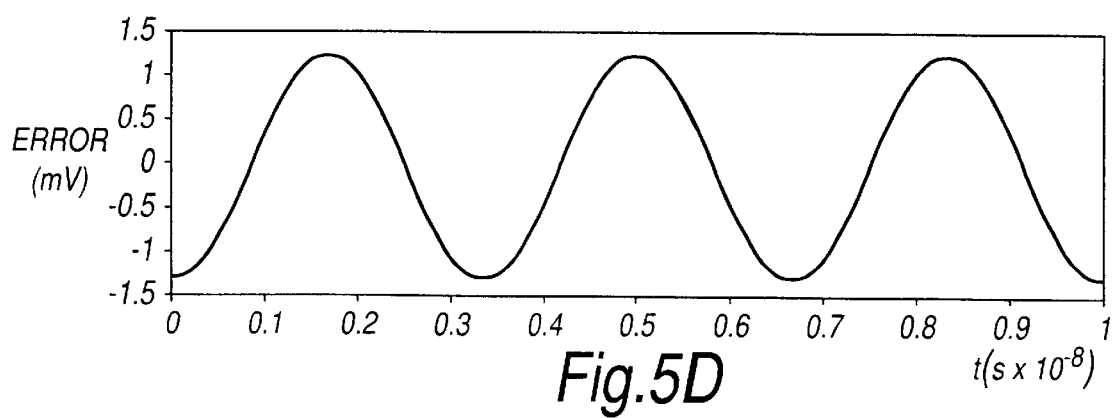

The output-voltage-dependent delay manifests itself as an error in the output voltage at any given time. This error is the product of the slew rate of the FIG. 5(A) waveform (as shown in FIG. 5(C)) and the delay Δt as shown in FIG. 5(B). This error is plotted in FIG. 5(D). As FIG. 5(D) shows, the error oscillates about 0 at a frequency of 3f. This means that the error appears as a third harmonic component in the output signal having a magnitude that is a function of the square of the output voltage.

When the cascode transistors are provided in the circuitry, as in FIG. 4, the main switching transistors S1 and S2 in each cell are shielded from the output voltage variation, with the change $\Delta V_{INT}$ being reduced by a factor of, for example, 2.5 relative to the output voltage change $\Delta V$. The error in the FIG. 4 circuitry is dependent on the change $\Delta V_{INT}$ rather than on $\Delta V$, so that the magnitude of the error is reduced by the square of the ratio between $\Delta V$ and $\Delta V_{INT}$. For example, when $\Delta V/\Delta V_{INT}$ is 2.5, the magnitude of the error will be six times (approximately $2.5^2$) lower than when no cascode transistors are provided.

The cascode transistors 22 and 24 do add some signal-dependent delay to the output of each segment. Accordingly, when providing cascode transistors in circuitry embodying the present invention, two effects need to be considered. The first effect is the pulse width modulation caused by the switching time being dependent upon the output voltage. For the reasons explained above, cascode transistors connected with the output terminals are effective in reducing or removing the first effect. However, a secondary effect is caused by the cascode transistors themselves. This secondary effect is that the bandwidth of each cascode transistor itself depends on the current flowing through it, i.e. the output current. This is because the output conductance $g_m$ of each cascode transistor is proportional to the square root of the current flowing through the transistor, and the bandwidth of the transistor is proportional to $g_m/C$, where C is the total capacitance between the cascode-transistor source (intermediate node IN1 or IN2) and GND. This varying bandwidth causes distortion due to both phase modulation and amplitude modulation.

It is in the light of the secondary effect that in the FIG. 4 embodiment each segment has its own pair of cascode transistors 22 and 24. The reason for this will be explained by way of comparison with a second embodiment of the present invention, shown in FIG. 6, in which all of the segments are connected in common to a single pair of cascode transistors. This configuration will be referred to hereinafter as a "common configuration" of the cascode transistors. The configuration of the FIG. 4 embodiment, in which each segment has its own individual pair of cascode transistors will be referred to hereinafter as a "separate configuration" of the cascode transistors.

Figure 6:
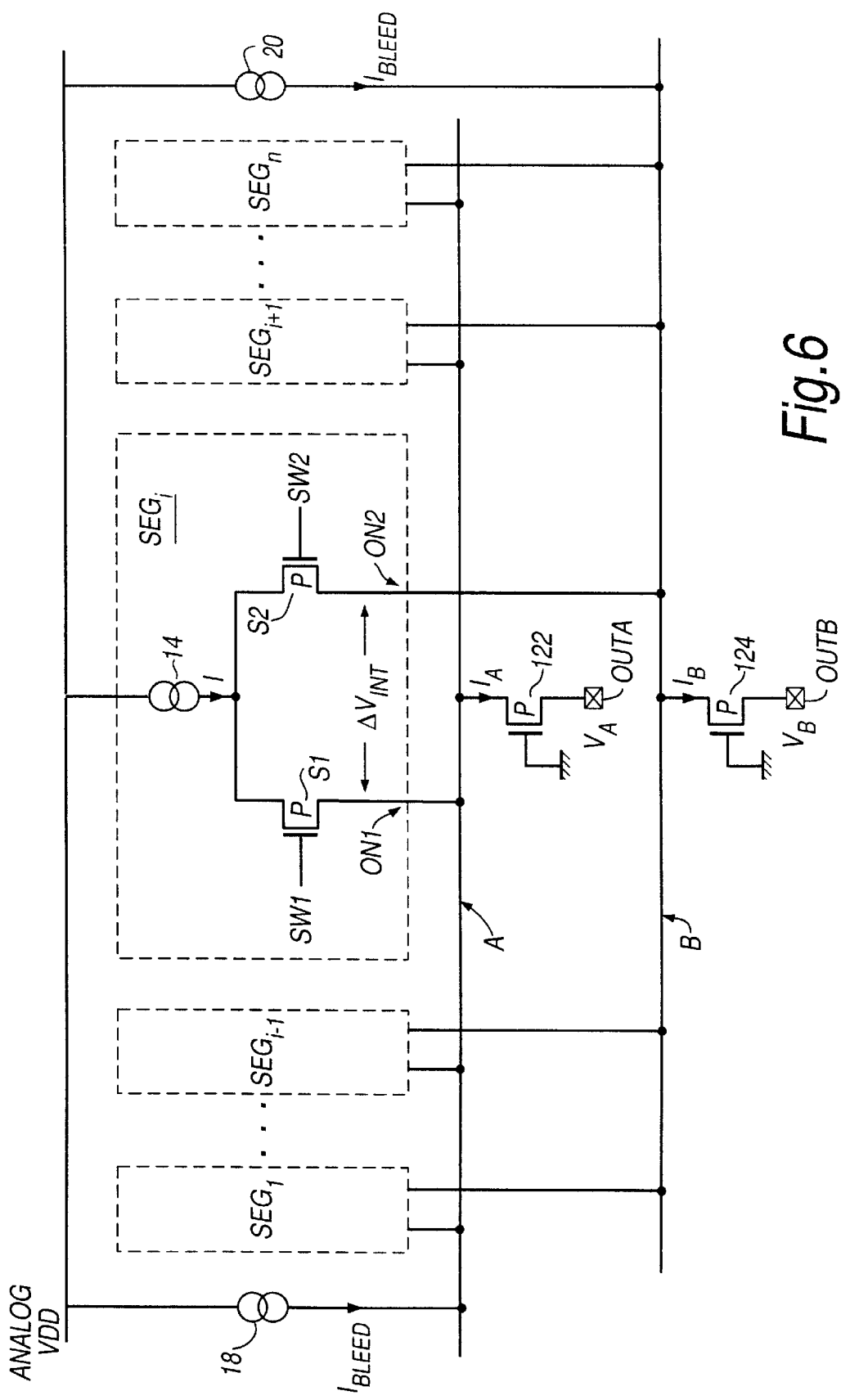
FIG. 6 shows parts of current switching circuitry according to a second embodiment of the present invention.

Referring to FIG. 6, current switching circuitry in the second embodiment of the present invention has, in each segment, a constant current source 16 for supplying a substantially constant current I to a common node CN of the segment. In this case, a first main switching transistor S1 of the segment is connected directly between the common node CN and a first output node ON1 of the segment, and a second main switching transistor S2 is connected directly between the common node CN and a second output node ON2 of the segment. As in the FIG. 4 embodiment, all of the respective first output nodes ON1 of the different segments are connected in common to a first connection line A of the circuitry, and all of the respective second output nodes ON2 of the segments are connected in common to a second connection line B of the circuitry. A first current bleed circuit 18 is connected for applying a substantially constant bleed current $I_{BLEED}$ to the first connection line A, and a second current bleed circuit 20 is connected for supplying a substantially constant bleed current $I_{BLEED}$ to the second connection line B. In this case, each bleed current $I_{BLEED}$ is, for example, approximately equal to one quarter of the sum $\Sigma I$ of all the individual currents I sourced by the segments.

In this embodiment, a single first cascode transistor 122 has its source connected to the first connection line A, its drain connected to a first output terminal OUTA of the circuitry, and its gate connected to GND. Similarly, a single second cascode transistor 124 has its source connected to the second connection line B, its drain connected to a second output terminal OUTB of the circuitry, and its gate connected to GND.

The second embodiment shown in FIG. 6 operates in basically the same manner as the first embodiment described previously with reference to FIG. 4. Each cascode transistor 122 or 124 serves to shield the switching transistors S1 and S2 in each segment from variations in potential of the output terminals OUTA and OUTB during use of the circuitry.

Figure 7:
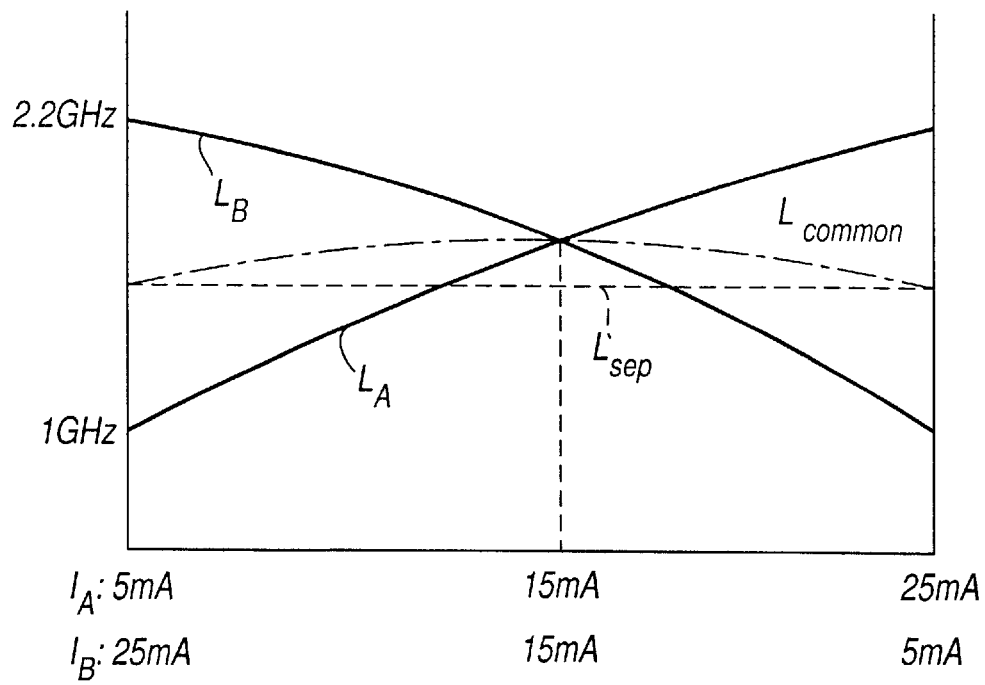
FIG. 7 shows a variation in bandwidth of cascode transistors in embodiments of the present invention.
Figure 7:
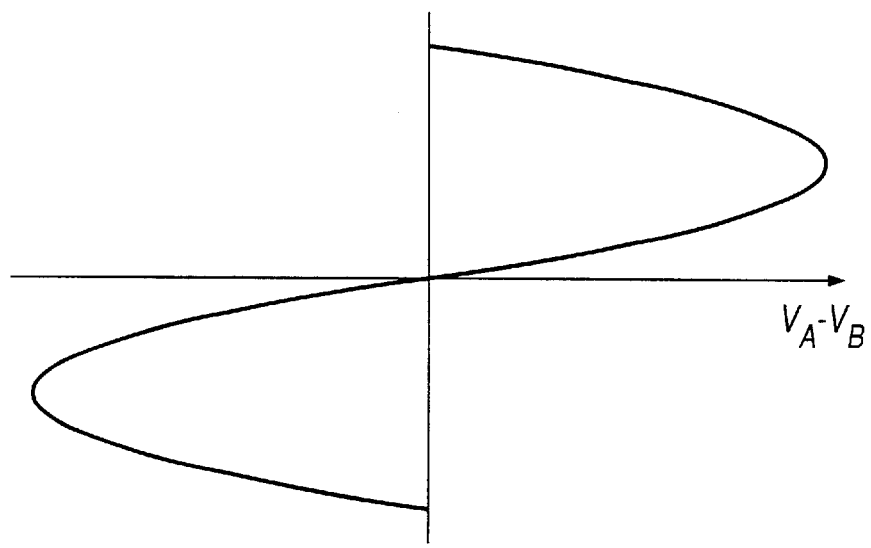

FIG. 7 shows how the bandwidth of the cascode transistors 122 and 124 varies with output current. A first line $L_A$ represents a bandwidth of the cascode transistor 122 associated with the output terminal OUTA. A second line $L_B$ represents a bandwidth of the cascode transistor associated with the output terminal OUTB. The horizontal axis FIG. 7 denotes the current flowing through each cascode transistor as the output voltage $V_A - V_B$ changes between its full-scale negative value −FS and its full-scale positive value +FS. When the output voltage is +FS all of the first switching transistors S1 are turned ON and all of the second switching transistors are turned OFF. Thus, the current flowing through the cascode transistor 122 has its maximum value of, for example, 25 mA ($\Sigma I$ for all segments $+I_{BLEED}$), whereas the current flowing through the cascode transistor 124 has its minimum value of, for example, 5 mA ($I_{BLEED}$ alone). In this state, the bandwidth of the cascode transistor 122 has its maximum value of, for example, 2.2 GHz, and the bandwidth of the cascode transistor 124 has its minimum value of, for example, 1 GHz, because (as mentioned previously) the bandwidth of each cascode transistor is proportional to the square root of the current IDS flowing through it.

As the output voltage $V_A - V_B$ falls progressively from +FS to −FS, progressively more current flows through the cascode transistor 124 and progressively less current flows through the cascode transistor 122. Thus, the bandwidth of the cascode transistor 122 falls from right to left along line $L_A$ in FIG. 7 and the bandwidth of the cascode transistor 124 rises from right to left along line $L_B$ in FIG. 7. At the full-scale negative value −FS of output voltage the cascode-transistor bandwidths are reversed as compared to the +FS state.

When the cascode transistors are connected in the common configuration of FIG. 6, the effect of the bandwidth variations of the cascode transistors is that, as shown by the curve $L_{common}$, the overall bandwidth (differential bandwidth) varies and is lowest at the ends and highest in the middle. This is a result of the common configuration of the cascode transistors which means that the output currents of the different segments are combined before reaching the cascode transistors.

The combined current from all segments flowing through each cascode transistor therefore varies across the full range of values from 5 mA to 25 mA in FIG. 7 (at least in steps corresponding to the number of segments). For any change in the output currents, therefore, one cascode transistor sees a fall in current (and hence bandwidth) whilst the other cascode transistor sees a rise in current (and hence bandwidth). The loss in bandwidth of the cascode transistor that is declining in bandwidth always outweighs the gain in bandwidth of the cascode transistor that is increasing in bandwidth, so that the differential bandwidth has its peak value at the midpoint along the curve $L_{common}$ (at which $I_A = I_B$) and reduces according to a function of the respective bandwidths of the cascode transistors. The differential bandwidth in the common configuration case therefore follows the curve $L_{common}$ in FIG. 7 and varies with output current.

In the FIG. 4 embodiment, having the separate configuration of cascode transistors, the effective overall bandwidth (differential bandwidth) of the circuitry follows the horizontal line $L_{sep}$ in FIG. 7, which passes through the end points of the curve $L_{common}$.

In the separate configuration case, the current flowing through the cascode-transistors in each segment only changes from a minimum value ($I_{BLEED} \simeq 50$ μA) to a maximum value ($I+I_{BLEED} \simeq 350$ μA) with no intermediate current values as in the common configuration case. This means that, whatever the total output current $I_A$ or $I_B$ one cascode transistor always changes from a minimum-bandwidth state to a maximum-bandwidth state at the same time as the other cascode transistor changes from the maximum-bandwidth state to the minimum-bandwidth state. The differential (combined) bandwidth (intermediate between the minimum and maximum bandwidths) for each segment is therefore the same for any change in output current. The differential bandwidth for all segments (i.e. the overall differential bandwidth) is therefore flat across the full range of output currents and has the same value as the end values along $L_{common}$. Although this means that the differential bandwidth in the separate configuration case is equal to the minimum differential bandwidth in the common configuration case, it is the variation in bandwidth that leads to distortion so the performance in the separate configuration case is significantly better in terms of reducing distortion.

Figure 8:
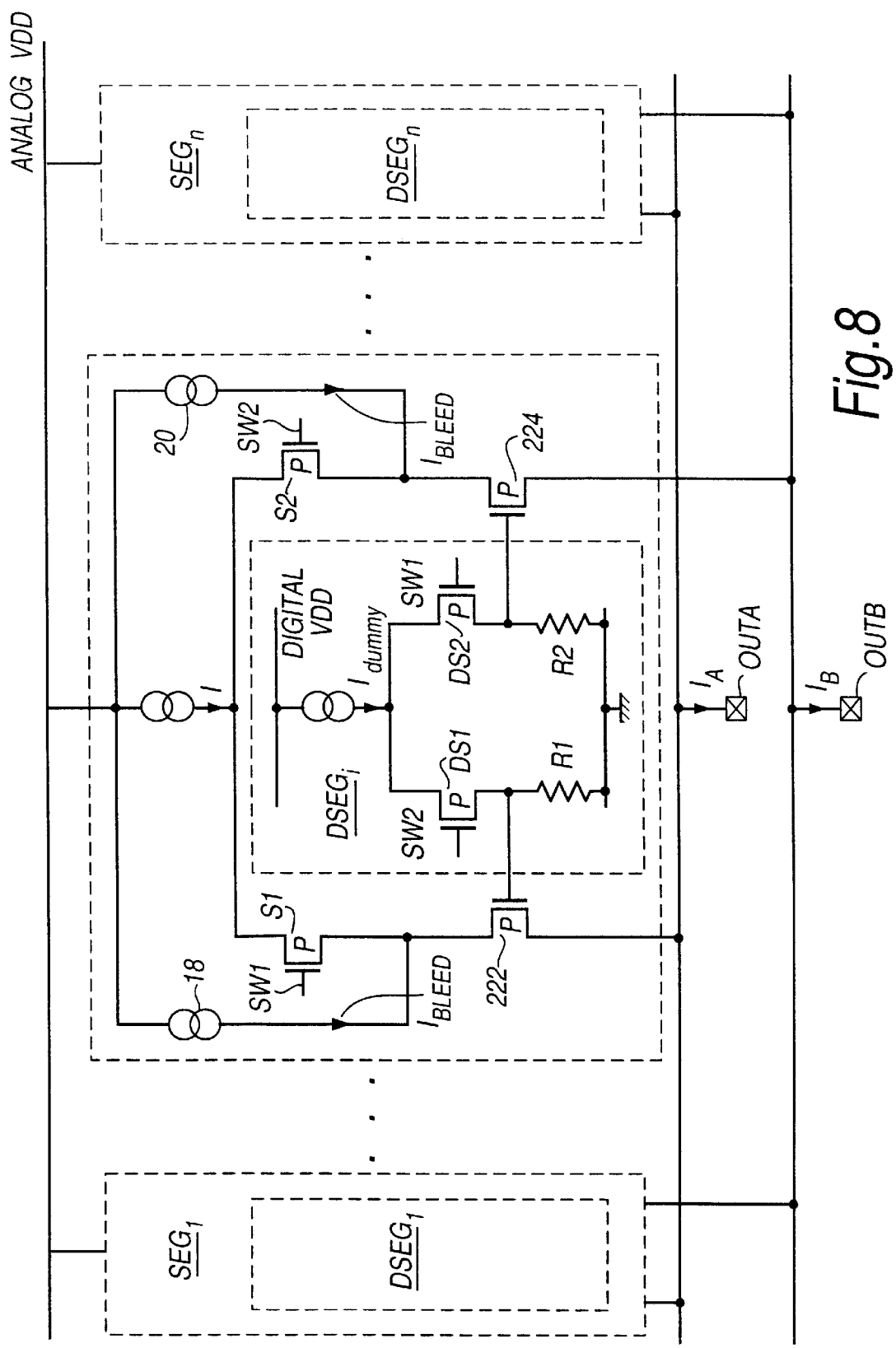
FIG. 8 shows parts of current switching circuitry according to a third embodiment of the present invention.

Next, a third embodiment of the present invention will be described with reference to FIG. 8. In FIG. 8, current switching circuitry 60 has, in each segment, a pair of main switching transistors S1 and S2 connected for receiving mutually-complementary switching signals SW1 and SW2 as in the preceding embodiments. The first switching transistor S1 is connected between the segment's common node CN and a first intermediate node IN1 of the segment, as in the first embodiment. Similarly, the second switching transistor S2 is connected between the segment's common node CN and a second intermediate node IN2 of the segment.

Each segment also has its own individual pair of cascode transistors 222 and 224. The first cascode transistor 222 has its source connected to the first intermediate node IN1, its drain connected to a first output node ON1 of the segment and its gate connected to a first dummy DAC output node DON1. The second cascode transistor 224 has its source connected to the intermediate node IN2, its drain connected to a second output node ON2 of the segment and its gate connected to a second dummy DAC output node DON2.

As in the first embodiment (FIG. 4) all of the respective output nodes ON1 of the segments are connected in common to a first connection line A of the circuitry, to which a first output terminal OUTA of the circuitry is connected. Similarly, all of the respective output nodes ON2 of the segments are connected in common to a second connection line B of the circuitry, to which a second output terminal OUTB of the circuitry is connected. Respective current bleed circuits 18 and 20 are connected respectively to the first and second intermediate nodes IN1 and IN2 in each segment, as in the first embodiment.

For each segment SEG (hereinafter "main segment") in the FIG. 8 current steering circuitry there is also provided a corresponding segment DSEG of a dummy DAC used to provide the gate potentials of the cascode transistors 222 and 224 in the main segment SEG concerned. Only one such dummy segment DSEG is shown in FIG. 8. The dummy DAC segment DSEG is constituted in the same basic way as its corresponding main segment. Thus, each dummy DAC segment DSEG comprises its own constant current source 216 which supplies a substantially constant current $I_{dummy}$ to a common node DCN of the dummy segment. The dummy segment DSEG further comprises respective first and second dummy switching transistors DS1 and DS2. The first dummy switching transistor DS1 is connected between the common node DCN and the first dummy DAC output node DON1 of the dummy segment, and the second dummy switching transistor DS2 is connected between the common node DCN and the second dummy output node DON2 of the dummy segment. The switching signal SW2 applied to the gate of the second switching transistor in the main segment SEG is applied to the gate of the first dummy switching transistor DS1 in the dummy segment DSEG. Similarly, the switching signal SW1 applied to the first switching transistor in the main segment is applied to the gate of the second dummy switching transistor DS2. Thus, when S1 and S2 are ON and OFF respectively, DS1 and DS2 are OFF and ON respectively.

Also, the dummy DAC segment DSEG comprises first and second resistors R1 and R2, each connected between the gate of one of the cascode transistor 222 and 224 and GND.

Operation of the FIG. 8 embodiment will now be described.

As in the preceding embodiments, the output-terminal potentials $V_A$ and $V_B$ vary in use of the circuitry in accordance with the applied binary input word. The first and second cascode transistors 222 and 224 serve the same basic purpose, namely to shield the main switching transistors S1 and S2 in each main segment from such potential variations. In this embodiment, however, each cascode transistor performs an active cascode function, in which the gate potential of the cascode transistor is varied in dependence upon the binary input word so as to reduce still further the variations in potential at the intermediate nodes IN1 and IN2 of each segment as compared to the "passive cascode" arrangement of the first embodiment.

The active cascodes operate as follows.

In the dummy DAC segment DSEG corresponding to each main segment SEG, the current $I_{dummy}$ sourced by the constant current source 16 is steered selectively to the resistor R1 or the resistor R2, depending on the states of the switching signals SW1 and SW2 of the main segment. Thus, when SW1 has the low logic level L and SW2 has the high logic level H, the current $I_{dummy}$ is steered to the resistor R2 by the second dummy switching transistor DS2, so that the gate potential of the second cascode transistor 224 has a positive value equal to the product of $I_{dummy}$ and the resistance of the second resistor R2.

In each main segment, the current flowing through each cascode transistor changes between a high value equal to $I+I_{BLEED}$ when its associated main switching transistor S1 or S2 is ON and a low value $I_{BLEED}$ when its associated switching transistor is OFF. The magnitude of the gate-source voltage of each cascode transistor varies in accordance with the current flowing through the cascode transistor concerned so that as the current increases the gate-source voltage magnitude also increases slightly (i.e. the source potential becomes more positive with respect to the gate potential). This in turn means that the potential of the intermediate node IN1 or IN2 to which the cascode transistor is connected also rises slightly when the associated main switching transistor SW1 or SW2 is ON.

In order to compensate for this rise in potential of the associated intermediate node IN1 or IN2, in the FIG. 8 embodiment, the dummy DAC segment causes the gate potential of each cascode transistor whose associated main switching transistor is ON to be lower than when its associated main switching transistor is OFF. The change in gate potential from the OFF state to the ON state of the associated main switching transistor is, for example, of the order of 150 mV.

Because of the ability to change the gate potentials of the cascode transistors in the FIG. 8 embodiment, the shielding of the intermediate-node potentials provided by the cascode transistors is improved as compared to the first embodiment. Each intermediate node is maintained, for example, at a substantially constant potential of approximately 0.9V, irrespective of changes in the output-terminal potentials $V_A$ and $V_B$.

The magnitude of the current $I_{dummy}$ should be high enough to "move" the dummy output nodes DON1 and DON2 in potential fast enough to compensate for the change in intermediate-node potential that would otherwise occur as a result of the change in the currents flowing through the cascode transistors. For example, the current $I_{dummy}$ is of the order of half the current I steered by each main segment. The accuracy of the current $I_{dummy}$ is not critical. This means, for example, that the constant current source 216 used to supply the current $I_{dummy}$ can be supplied from a positive supply line having a potential that is lower than the positive supply for the current sources in the main segments. For example, the current sources 216 in the dummy DAC segments could be supplied from a positive supply line DIGITAL VDD used to supply power at a potential of 1.8V to digital circuitry within the DAC. By using a lower power supply voltage for the dummy segments, the power consumption of the dummy segments can be decreased.

Figure 9:
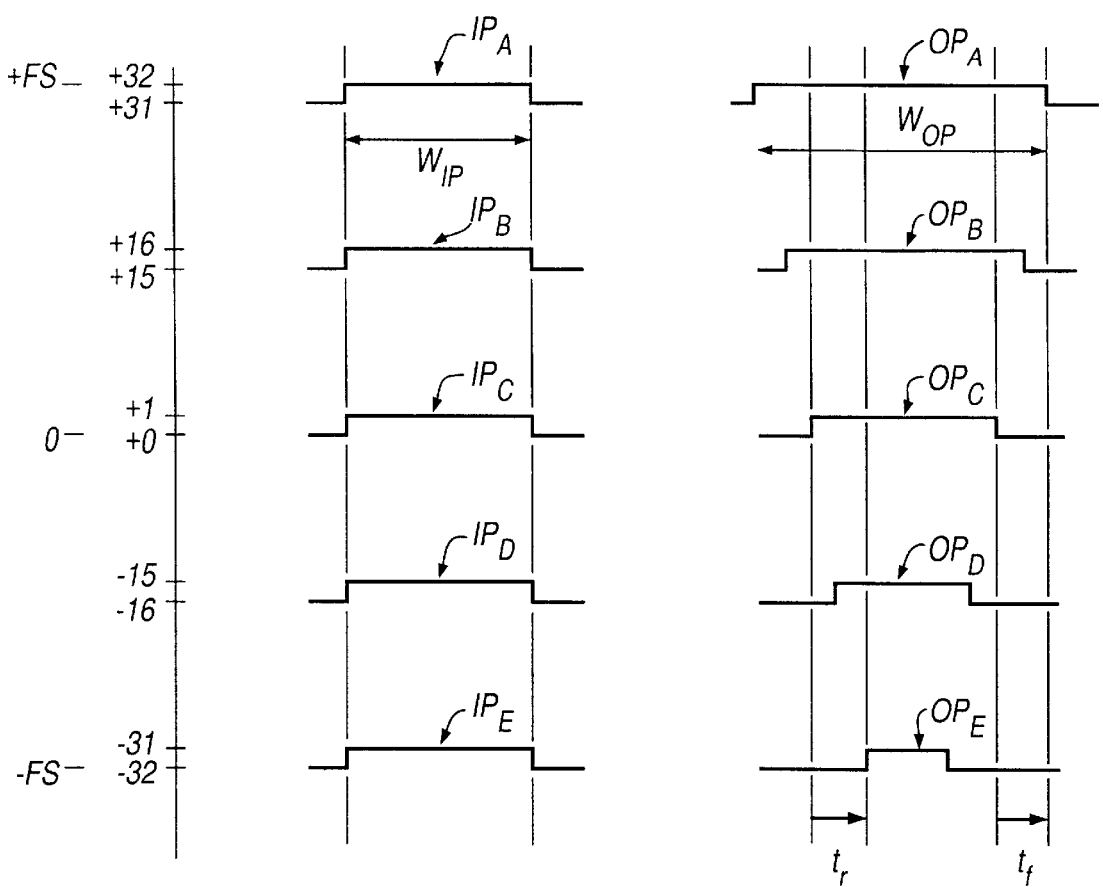
FIG. 9 shows explanatory diagrams for use in interpreting Tables 1 to 3 of the description.

Tables 1 to 3 below compare the performance of the first and third embodiments with the previously-considered circuitry of FIG. 3 without any cascode transistors. Table 1 relates to the FIG. 3 circuitry having no cascode transistors, Table 2 relates to the first embodiment (passive cascode arrangement) and Table 3 relates to the third embodiment (active cascode arrangement). Referring to FIG. 9, to compare the delay performances, a DAC having 64 segments was considered. The input of the DAC is variable from –FS to +FS. The effects of applying rectangular pulses of a unit step size (1/32 FS) to the binary input of the DAC at different input levels were simulated. Five different possibilities were considered, as represented respectively by rows A to E in Tables 1 to 3.

In the case of row A the input pulse $IP_A$ is a unit pulse from +31/32 FS to +FS. For row B the input pulse $IP_B$ is a unit pulse from +15/32 FS to +16/32 FS. In the case of row C the input pulse $IP_C$ is from 0 to +1/32 FS. In the case of row D the input pulse $IP_D$ is a unit pulse from –16/32 FS to –15/32 FS. In the case of row E the input pulse $IP_E$ is a unit pulse from –FS to –31/32 FS. Thus, each input pulse $IP_A$ to $IP_E$ causes just one segment to change state, and the delay in switching for this one segment was simulated.

As shown in FIG. 9 in each case A to E the output voltage $V_A$–$V_B$ of the DAC changes in response to the input pulse $IP_A$ to $IP_E$ to produce an output pulse $OP_A$ to $OP_E$. Each output pulse $OP_A$ to $OP_E$ has a rising edge which is delayed by a delay time $t_r$ and a falling edge which is delayed by a delay time $t_f$. The delay time $t_r$ each output-pulse rising edge is measured relative to the rising edge of the output pulse $OP_C$. Similarly the delay time $t_f$ of each output-pulse falling edge is measured relative to the falling edge of the output pulse $OP_C$. The delay times $t_r$ are given (in ps) in column 1 of each table. The delay times $t_f$ are given (in ps) in column 2 of each table. Column 3 gives an average delay time $t_{av}$ (in ps) of the delay times $t_r$ and $t_f$ for the input pulse concerned. Column 4 gives the width modulation (in ps) for the input pulse concerned. This width modulation is the difference Δw between the pulse width $w_{OP}$ of the output pulse and the pulse width $w_{IP}$ of the input pulse. This difference Δw is equal to $t_f$–$t_r$.

TABLE 1

No cascodes

| | $t_r$ | $t_f$ | $t_{av}$ | Δw |
|---|---|---|---|---|
| A | –2.73 | +3.07 | +0.17 | +5.80 |
| B | –1.41 | +1.49 | +0.04 | +2.90 |
| C | 0 | 0 | 0 | 0 |
| D | +1.49 | –1.41 | +0.04 | –2.90 |
| E | +3.08 | –2.73 | +0.17 | –5.80 |

TABLE 2

Passive Cascodes

| | $t_r$ | $t_f$ | $t_{av}$ | Δw |
|---|---|---|---|---|
| A | +0.61 | +0.95 | +0.78 | +0.34 |
| B | +0.10 | +0.27 | +0.18 | +0.17 |
| C | 0 | 0 | 0 | 0 |
| D | +0.27 | +0.10 | +0.18 | –0.17 |
| E | +0.95 | +0.61 | +0.78 | –0.34 |

TABLE 3

Active Cascodes

| | $t_r$ | $t_f$ | $t_{av}$ | Δw |
|---|---|---|---|---|
| A | +0.66 | +1.01 | +0.83 | +0.35 |
| B | +0.11 | +0.28 | +0.19 | +0.17 |
| C | 0 | 0 | 0 | 0 |
| D | +0.28 | +0.11 | +0.19 | –0.17 |
| E | +1.01 | +0.66 | +0.83 | –0.35 |

Comparing the results in Tables 1 to 3, it can be seen that the pulse width modulation when no cascodes are provided is a factor of about 17 times worse than when passive or active cascodes are provided, as in the first and third embodiments respectively. There is a small penalty to be paid in terms of average delay. When passive or active cascodes are employed, the signal-dependent delay increases by a factor of around five, as compared to when no cascodes are provided. However, overall the performance both with passive and active cascodes is improved greatly compared to the no-cascode arrangement.

In the common configuration case, the worst-case average delay $t_{av}$ is much higher than in the separate configuration case, for example worst-case $t_{av}$=3.4 ps. The width modulation Δw, however, is as low as 0.1 ps. The high average delay in the common configuration case still makes the separate configuration preferable.

Incidentally, it will be observed that in this particular comparative example the active cascode arrangement has a slightly worse performance, both in terms of average delay and pulse width modulation, than the passive cascode arrangement. This result is at first sight surprising but investigations have suggested that this effect arises because, although the active cascode arrangement is effective in maintaining the drain potentials of the main switching transistors substantially constant in the steady state, during actual switching of each segment a small fluctuation occurs in the drain potentials because the gate potentials of the cascode transistors do not move fast enough to compensate completely for the changes in current flowing through the cascode transistors.

Figure 10:
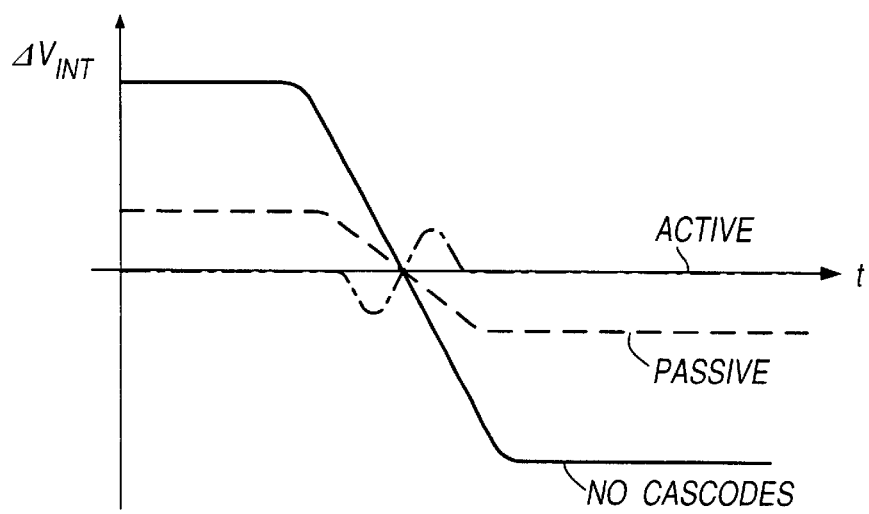
FIG. 10 shows an explanatory diagram for use in comparing the performances of embodiments of the invention with the FIG. 3 circuitry.

This effect is illustrated in FIG. 10 which compares the change in potential difference $\Delta V_{INT}$ between the main switching transistor drains in response to a change $\Delta V$ in potential difference between the output terminals OUTA and OUTB for the FIG. 3 circuitry (no cascodes) and the first and third embodiments. When no cascodes are provided $\Delta V_{INT}$ is equal to $\Delta V$. When passive cascodes are employed, $\Delta V_{INT}$ tracks $\Delta V$ but with a smaller magnitude. However, when active cascodes are used, $\Delta V_{INT}$ undergoes a complementary variation to $\Delta V$, albeit of small magnitude compared to $\Delta V$ itself. This complementary variation gives rise to signal-dependent delay of comparable magnitude to that of the passive cascode arrangement. For this reason, in many applications the passive cascode arrangement will be preferable to the active cascode arrangement, as it is simpler to implement and, not having the dummy DAC segments, has lower power consumption.

Next, a fourth embodiment of the present invention will be described with reference to FIG. 11. As in the case of the third embodiment, the fourth embodiment also has active cascodes but, unlike in the third embodiment, the active cascodes are provided in the "common configuration" used in the second embodiment (FIG. 6).

Figure 11:
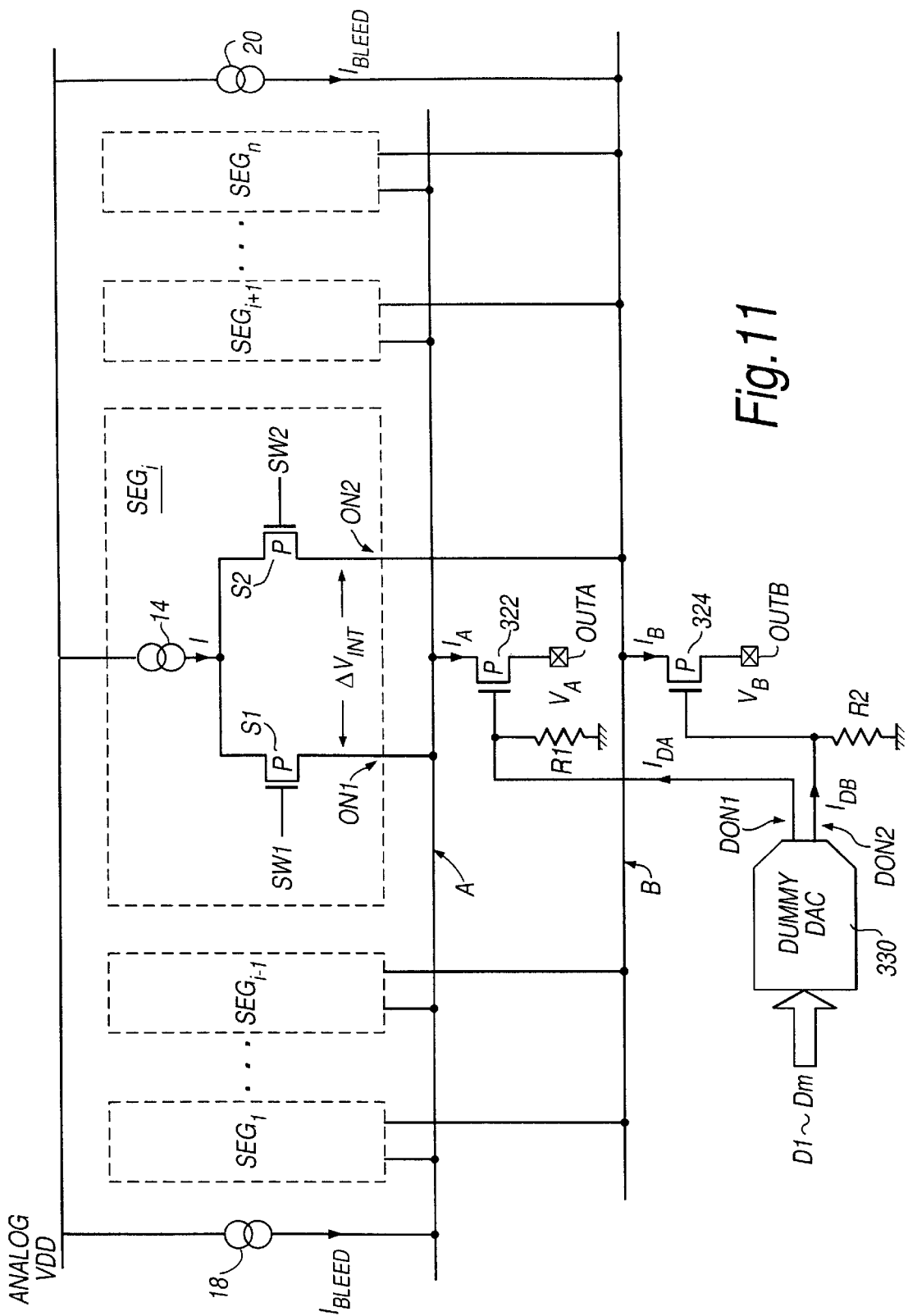
FIG. 11 shows parts of current switching circuitry according to a fourth embodiment of the present invention.

In the FIG. 11 embodiment the segments $SEG_1$ to $SEG_n$ are connected together in the same manner as in the second embodiment. First and second cascode transistors 322 and 324 are connected between the connection lines A and B and the output terminals OUTA and OUTB as in the second embodiment. In the FIG. 11 embodiment, however, each cascode transistor 322 or 324 does not have its gate connected to GND. Instead, the gate of the first cascode transistor 322 is connected to a first output node DON1 of a dummy DAC circuit 330, and the gate of the second cascode transistor 324 is connected to a second output node DON2 of the dummy DAC circuit 330.

The dummy DAC circuit 330 supplies at its first output node DON1 a current $I_{DA}$ and supplies at its second output node DON2 a second output current $I_{DB}$ The dummy DAC circuit 330 receives at its input the same binary input word that is applied to the main DAC. The dummy DAC circuit 330 differs from the main DAC in that, when the binary input word has its lowest value, the output current $I_{DA}$ has its highest value and the output current $I_{DB}$ is zero. As the binary input word increases progressively in value, the output current IDA decreases and the output current $I_{DB}$ increases until, at the highest value of the binary input word, $I_{DA}$ is zero and $I_{DB}$ has its maximum value.

The effect of the dummy DAC circuit 330 is that, as in the third embodiment, the gate potential of each cascode transistor 332 or 324 reduces as the current flowing through the cascode transistor increases. This shields the output nodes ON1 and ON2 of the main segments from the effect of a rise in gate-source potential of each cascode transistor as the current flowing through the transistor increases.

The dummy DAC circuit 330 can be implemented in any suitable way. However, one preferred possibility is to implement the dummy DAC circuit by providing a dummy DAC segment DSEG for each segment SEG of the main DAC, as in the third embodiment. In this case, the only modification compared to the third embodiment is that the respective first output nodes DON1 of all the dummy DAC segments in the third embodiment should be connected in common to the gate of the first cascode transistor 322 and the respective second output nodes DON2 of all of the dummy DAC segments should be connected in common to the gate of the second cascode transistor 324. There is no need for each dummy DAC segment to contain a pair of resistors R1 and R2 as in the third embodiment; a single pair of resistors can be connected to the cascode-transistor gates in the fourth embodiment.

The foregoing embodiments of the present invention have been designed for use in a differential output configuration in which each output terminal is connected via a load impedance (resistance) to GND. However, it will also be understood that it is possible to use current switching circuitry embodying the present invention in a single-ended configuration in which the output voltage is generated from one of the output terminals alone, the other output terminal being unused.

The cascode transistors in embodiments of the present invention must be maintained in the saturated condition in which the cascode transistor approximates to a constant current device. In practice, the characteristics of field-effect transistors can vary significantly with fabrication process variations and temperature variations, and the parameter $V_{DS(SAT)}$ of the cascode transistors, which is a measure of the minimum drain-source voltage needed for operation in the saturated mode, can vary by a factor of 2. Because of this, it is desirable in embodiments of the present invention to adjust the gate-source potentials of the cascode transistor in dependence upon a measure of $V_{DS(SAT)}$ produced in the circuitry when in use. For example, in the active cascode embodiments the resistances R1 and R2 into which the dummy DAC output currents are sunk can be made variable in dependence upon the measure of $V_{DS(SAT)}$. This means that the voltages developed across the resistances can be adjusted to track $V_{DS(SAT)}$. The resistances R1 and R2 in this case can be implemented using NMOS transistors. One example of control circuitry suitable for adjusting NMOS-transistor-implemented resistors in dependence upon a measure of $V_{DS(SAT)}$ will now be described with reference to FIG. 12.

Figure 12:
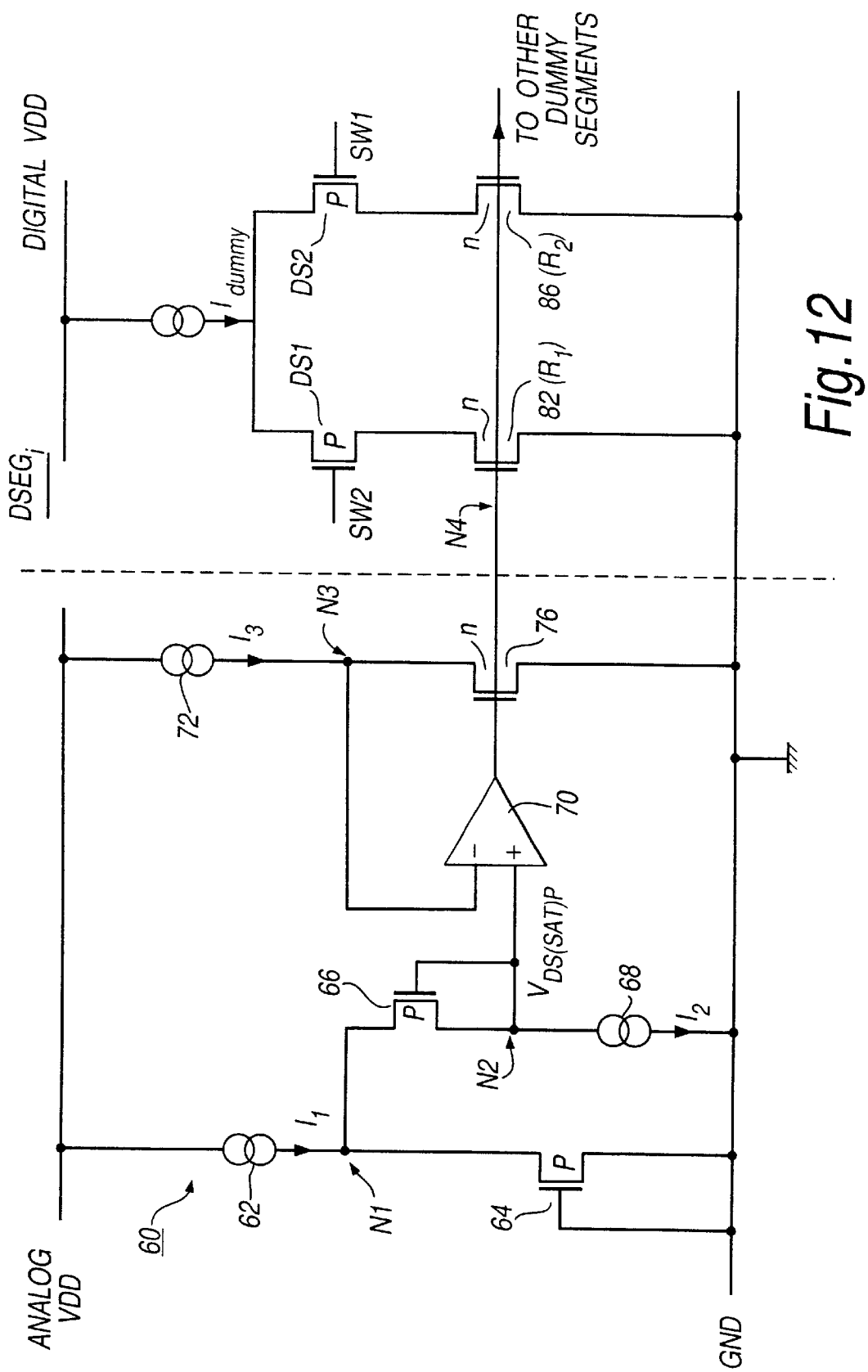
FIG. 12 shows one example of control circuitry suitable for use in embodiments of the present invention.

In FIG. 12 the control circuitry 60 includes a first constant current source 62 connected between a positive power supply line ANALOG VDD of the circuitry and a first node N1. A first PMOS FET 64 has its source connected to the node N1 and its gate and drain connected to the ground potential supply line GND.

The circuitry also includes a second PMOS FET 66 which has its source connected to the node N1. The gate and drain of the PMOS FET 66 are connected to a second node N2, and a constant current sink 68 is connected between the node N2 and GND.

The current $I_1$ sourced by the constant current source 62 is large compared to the current $I_2$ sunk by the constant current sink 68. Also, the first PMOS FET 64 is narrow compared to the second PMOS FET 66. For example, the width of the FET 64 is w and the width of the FET 66 is 3w, and $I_1=4I_{SW}$ and $I_2=I_{SW}$, where $I_{SW}$ is the current which flows through each switching transistor S1 or S2 when ON.

The circuitry 60 further includes a high-output-resistance transconductance amplifier 70 having a first (negative) input connected to the node N2. A second (positive) input of the amplifier 70 is connected to a node N3 of the circuitry. A second constant current source 72 is connected between the ANALOG VDD and the node N3. An NMOS FET 76 is connected in series between the node N3 and GND. The NMOS FET 76 has its drain connected to the node N3, its gate connected to the output of the amplifier 70 and its source connected to GND. An output node N4 of the circuitry 60 is connected to the output of the amplifier 70.

To enable the resistances of the resistors R1 and R2 in each dummy segment $DSEG_1$ to be varied, the resistors R1 and R2 in each dummy segment are implemented using respective first and second NMOS FET transistors 82 and 86. The first NMOS FET 82 has its drain connected to the drain of the dummy switching transistor DS1, its gate connected to the output node N4 of the control circuitry and its source connected to GND. The NMOS FET 86 has its drain connected to the drain of the dummy switching transistor DS2, its gate connected to the output node N4 and its source connected to GND. In this embodiment the NMOS FETs 82 and 86 each have the same size as the NMOS FET 76. Alternatively, there may be a predetermined scaling factor between the two FETS 82/86 and the FET 76.

The output node N4 is also connected to resistance-setting NMOS FETs in further dummy segments of the dummy DAC, so as to enable the control circuitry 60 to operate in common for all segments.

Operation of the FIG. 12 control circuitry will now be described. The elements 62 to 68 serve to generate at the node N2 a potential $V_{DS(SAT)P}$ which is a measure of the drain-source saturation voltage of the cascode transistors and/or the switching transistors in the main segments (FIG. 8). Because of the difference in currents flowing through the FETs 64 and 66, and their different widths, the ratio of the current densities in the FETs 64 and 66 is 9:1 $(=(I_1-I_2)/w:I_2/3w)$. Because $V_{DS(SAT)}$ is proportional to the square root of current density, the ratio between the respective $V_{DS(SAT)}$s of the FETs 64 and 66 is 3:1. The respective $V_T$s of the FETs 64 and 66 are substantially the same. The potential at node N1 becomes equal to $V_{DS(SAT)64}+V_{T64}$, where the drain-source saturation voltage $V_{DS(SAT)64}$ of the FET 64 is e.g. 0.9V and the threshold voltage $V_{T64}$ of the FET 64 is e.g. 1V. Thus, the potential $V_{N1}$ of node N1 is, for example, 1.9V. The voltage drop across the FET 66 is $V_{DS(SAT)66}+V_{T66}$, where $V_{DS(SAT)66}$ is e.g. 0.3V and $V_{T66}$ is e.g. 1V, i.e. 1.3V. Thus, the potential at node N2 is approximately equal to $V_{DS(SAT)64}-V_{DS(SAT)66}$, and this potential is taken as the measure $V_{DS(SAT)P}$ of drain-source saturation voltages of the switching and cascode transistors in the main segments.

Incidentally, because the measure $V_{DS(SAT)P}$ is derived from the difference $V_{DS(SAT)64}-V_{DS(SAT)66}$ between the respective $V_{DS(SAT)}$ of two FETs 64 and 66, it is possible that it will not accurately reflect the actual $V_{DS(SAT)}$s of the FETs of interest in the current switching circuitry, i.e. the switching transistors and the cascode transistors (if used). However, if it is expected that the actual $V_{DS(SAT)}$s of the FETs of interest will be, say, 0.6V in total, then it is preferable to set the conditions of the FETs 64 and 66 so that their respective $V_{DS(SAT)}$s are offset equally on either side of that total actual $V_{DS(SAT)}$, which is why in this example $V_{DS(SAT)64}$ is set to 0.9V and $V_{DS(SAT)66}$ is set to 0.3V.

The second constant current source 72 sources a current $I_3$ that in this embodiment is substantially equal to the current $I_{dummy}$ sourced by the constant current source in the dummy segment. In this embodiment the NMOS FET 76 has the same (variable) resistance as the NMOS FET 82 used to provide the first resistor R1 and the NMOS FET 86 used to provide the second resistor R2. This means that the voltage at the node N3 is the same as the voltage at the drain of the dummy switching transistor that is ON. The effect of the amplifier 70, therefore, is to adjust the potential at the output node N4 until the potential at the node N3 is equal to the potential $V_{DS(SAT)P}$ of the node N2. Changing the N4-node potential changes the potential at the node N3 because the N4-node potential determines the resistance of the NMOS FET transistor 76 in the control circuitry.

In this way, in this embodiment the gate-source voltages of the cascode transistors 222 and 224 are adjusted in accordance with the measure $V_{DS(SAT)P}$. Alternatively, the resistances can be left fixed and the dummy DAC output currents can be adjusted in dependence upon the measure of $V_{DS(SAT)}$ to achieve adjustment of the gate-source voltages to compensate for $V_{DS(SAT)}$ variations. Such gate-source voltage adjustments can be applied even when the cascodes are not otherwise actively adjusted (e.g. using a dummy DAC) based on the currents flowing through the cascode transistors.

In the active cascode embodiments it is not essential for the gate voltages of the cascode transistors to be controlled to achieve a zero change in the potential difference $\Delta V_{INT}$ between the switching-transistor drains. For example, the gate voltages a could be adjusted to achieve a change in $\Delta V_{INT}$ of half the change in the potential difference $\Delta V$ between the output terminals.

Although the present invention has been described in relation to current steering circuitry used in a segmented DAC, it will be appreciated that in other embodiments the invention can be applied in any kind of circuitry which has segmented current switching circuitry. For example, the invention can be applied to programmable current generators and mixers.

In addition, although in embodiments of the present invention described above the currents switched in the different segments have been equal to one another, it will be appreciated that the invention can be applied even when the currents in the different segments are not equal to one another. For example, in some DACs the currents in different segments are scaled by a factor of 2 from one segment to the next.

It will also be understood that although in the foregoing embodiments p-channel FET transistors have been used, embodiments of the present invention can also make use of n-channel FETs. In this case the currents flow into the output terminals/nodes of the circuitry, rather than out of them, and the segments contain current sink circuits rather than current source circuits.

Also, in place of FET transistors, bipolar transistors can be used, as can any other kind of three-terminal current device such as a valve.

What is claimed is:

1. Current switching circuitry comprising:
   a plurality of circuitry segments, each having first and second connection nodes through which first and second controllable currents pass respectively when the current switching circuitry is in use, and switch circuitry for changing the respective magnitudes of the first and second controllable currents in dependence upon a switching signal applied to the segment;
   a first combiner, connected with the respective first connection nodes of the segments and also connected operatively with a first combined signal terminal, for combining the respective first controllable currents of the segments to produce a first combined signal at said first combined signal terminal;

a second combiner, connected with the respective second connection nodes of the segments and also connected operatively with a second combined signal terminal, for combining the respective second controllable currents of the segments to produce a second combined signal at said second combined signal terminal;

a first shielding circuit, connected between said first combined signal terminal and said switch circuitry in one or more of said segments, for shielding the switch circuitry in the segment(s) concerned from variations in potential arising from variations in potential of that terminal; and a second shielding circuit, connected between said second combined signal terminal and said switch circuitry in said one or more segments, for shielding the switch circuitry in the segment(s) concerned from variations in potential arising from variations in potential of that terminal.

2. Current switching circuitry as claimed in claim 1, wherein:

said first shielding circuit is connected between said first combined signal terminal and said switch circuitry in each of said segments for shielding the switch circuitry in each segment from variations in potential arising from variations in potential of that terminal; and said second shielding circuit is connected between said second combined signal terminal and said switch circuitry in each of said segments for shielding the switch circuitry in each segment from variations in potential arising from variations in potential of that terminal.

3. Current switching circuitry as claimed in claim 2, wherein each said shielding circuit has a shielding element provided in common for all of said segments, and each said combiner is connected to its said combined signal terminal via said shielding element.

4. Current switching circuitry as claimed in claim 3, wherein the or each shielding element comprises a cascode transistor.

5. Current switching circuitry as claimed in claim 4, wherein said cascode transistor is a field-effect transistor.

6. Current switching circuitry as claimed in claim 1, wherein each said shielding circuit has a shielding element for each of said one or more segments, and each said connection node is connected to said switch circuitry via such a shielding element.

7. Current switching circuitry as claimed in claim 6, wherein the or each shielding element comprises a cascode transistor.

8. Current switching circuitry as claimed in claim 7, wherein said cascode transistor is a field-effect transistor.

9. Current switching circuitry as claimed in claim 4, wherein said cascode transistor of at least one said shielding element has a control terminal whose potential is maintained at a substantially constant value in use of the circuitry.

10. Current switching circuitry as claimed in claim 4, wherein the cascode transistor of at least one said shielding element has a control terminal whose potential is adjusted in use of the circuitry so as to compensate for a change in potential difference between said control terminal and a current-path terminal of the transistor brought about by a change in magnitude of current flowing through the cascode transistor.

11. Current switching circuitry as claimed in claim 5, further comprising saturation condition maintaining circuitry for adjusting a gate potential of the field-effect transistor in dependence upon a measure of drain-source saturation voltage of the transistor, so as to maintain the transistor in a saturated operating condition irrespective of variations in said drain-source saturation voltage.

12. Current switching circuitry as claimed in claim 1, wherein:

said switch circuitry in each segment comprises a first switch element connected between said first connection node and a common node of the segment, and a second switch element connected between said second connection node and said common node; and each said segment further comprises constant current circuitry connected with said common node of the segment for causing a substantially constant current to flow through the common node when the circuitry is in use, and also comprises a switch controller operable, in dependence upon said switching signal applied to the segment, to change said switch circuitry from a first state, in which said first switch element is on and said second switch element is off, to a second state in which said first switch element is off and said second switch element in on.

13. Current switching circuitry as claimed in claim 12, wherein each said switch element comprises a switching transistor.

14. Current switching circuitry as claimed in claim 13, wherein each said switching transistor is a field-effect transistor.

15. Current switching circuitry as claimed in claim 1, wherein the or each said combiner produces its said combined signal by summing the respective controllable currents passing through said connection nodes to which the combiner concerned is connected.

16. Current switching circuitry as claimed in claim 15, wherein the or each said combiner has a connection line that interconnects said connecting nodes to which the combiner is connected, whereby the respective controllable currents passing through those connection nodes are summed.

17. Current switching circuitry as claimed in claim 12, further comprising current flow maintaining circuitry connected operatively with the or each said shielding circuit for maintaining a predetermined minimum flow of current through said second shielding circuit when the switch circuitry has said first state, and for maintaining a predetermined minimum flow of current through said second shielding circuit when said switch circuitry has said second state.

18. Digital-to-analog conversion circuitry comprising:

a plurality of circuitry segments, each having first and second connection nodes through which first and second controllable currents pass respectively when the circuitry is in use, and switch circuitry for changing the respective magnitudes of the first and second controllable currents in dependence upon a switching signal applied to the segment;

a first combiner, connected with the respective first connection nodes of the segments and also connected operatively with a first combined signal terminal, for combining the respective first controllable currents of the segments to produce a first combined signal at said first combined signal terminal;

a second combiner, connected with the respective second connection nodes of the segments and also connected operatively with a second combined signal terminal, for combining the respective second controllable currents of the segments to produce a second combined signal at said second combined signal terminal;

a first shielding circuit, connected between said first combined signal terminal and said switch circuitry in one or more of said segments, for shielding the switch circuitry in the segment(s) concerned from variations in potential arising from variations in potential of that terminal;

a second shielding circuit, connected between said second combined signal terminal and said switch circuitry in said one or more segments, for shielding the switch circuitry in the segment(s) concerned from variations in potential arising from variations in potential of that terminal; and decoder circuitry connected for receiving a digital input signal to be converted into a corresponding analog output signal, and operable to derive from the received digital input signal a set of said switching signals for application respectively to said segments.

19. Digital-to-analog conversion circuitry as claimed in claim 18, wherein:

said switch circuitry in each segment comprises a first switch element connected between said first connection node and a common node of the segment, and a second switch element connected between said second connection node and said common node;

each said segment further comprises constant current circuitry connected with said common node of the segment for causing a substantially constant current to flow through the common node when the circuitry is in use, and also comprises a switch controller operable, in dependence upon said switching signal applied to the segment, to change said switch circuitry from a first state, in which said first switch element is on and said second switch element is off, to a second state in which said first switch element is off and said second switch element in on; and said substantially constant currents flowing through said common nodes of the different segments are substantially equal to one another.

20. Digital-to-analog conversion circuitry as claimed in claim 18, wherein:

said first shielding circuit is connected between said first combined signal terminal and said switch circuitry in each of said segments for shielding the switch circuitry in each segment from variations in potential arising from variations in potential of that terminal;

said second shielding circuit is connected between said second combined signal terminal and said switch circuitry in each of said segments for shielding the switch circuitry in each segment from variations in potential arising from variations in potential of that terminal;

each said shielding circuit has a shielding element provided in common for all of said segments, and each said combiner is connected to its said combined signal terminal via said shielding element;

the or each shielding element comprises a cascode transistor;

the cascode transistor of at least one said shielding element has a control terminal whose potential is adjusted in use of the circuitry so as to compensate for a change in potential difference between said control terminal and a current-path terminal of the transistor brought about by a change in magnitude of current flowing through the cascode transistor;

the digital-to-analog conversion circuitry further comprising:

a dummy digital-to-analog converter operable to generate said control-terminal potential for the or each said cascode transistor in dependence upon said digital input signal.

21. Digital-to-analog conversion circuitry as claimed in claim 18, wherein:

each said shielding circuit has a shielding element for each of said one or more segments, and each said connection node is connected to said switch circuitry via such a shielding element;

the or each shielding element comprises a cascode transistor;

the cascode transistor of at least one said shielding element has a control terminal whose potential is adjusted in use of the circuitry so as to compensate for a change in potential difference between said control terminal and a current-path terminal of the transistor brought about by a change in magnitude of current flowing through the cascode transistor;

the digital-to-analog conversion circuitry further comprising:

a dummy digital-to-analog converter operable to generate said control-terminal potential for the or each said cascode transistor in dependence upon said digital input signal.

22. Digital-to-analog conversion circuitry as claimed in claim 20, wherein said dummy digital-to-analog converter has a plurality of dummy segments corresponding respectively to said segments of the current switching circuitry, each said dummy segment serving to generate said control-terminal potential for the or each cascode transistor of its corresponding segment of the current switching circuitry.

23. Current switching circuitry comprising:

a plurality of circuitry segments, each having first and second connection nodes through which first and second controllable currents pass respectively when the circuitry is in use, and switching means for changing the respective magnitudes of the first and second controllable currents in dependence upon a switching signal applied to the segment;

first combining means, connected with the respective first connection nodes of the segments and also connected operatively with a first combined signal terminal, for combining the respective first controllable currents of the segments to produce a first combined signal at said first combined signal terminal;

second combining means, connected with the respective second connection nodes of the segments and also connected operatively with a second combined signal terminal, for combining the respective second controllable currents of the segments to produce a second combined signal at said second combined signal terminal;

first shielding means, connected between said first combined signal terminal and said switching means in one or more of said segments, for shielding the switching means in the segment(s) concerned from variations in potential arising from variations in potential of that terminal; and second shielding means, connected between said second combined signal terminal and said switching means in said one or more segments, for shielding the switching means in the segment(s) concerned from variations in potential arising from variations in potential of that terminal.

24. Digital-to-analog conversion circuitry comprising:

a plurality of circuitry segments, each having first and second connection nodes through which first and second controllable currents pass respectively when the circuitry is in use, and switching means for changing the respective magnitudes of the first and second controllable currents in dependence upon a switching signal applied to the segment;

first combining means, connected with the respective first connection nodes of the segments and also connected operatively with a first combined signal terminal, for combining the respective first controllable currents of the segments to produce a first combined signal at said first combined signal terminal;

second combining means, connected with the respective second connection nodes of the segments and also connected operatively with a second combined signal terminal, for combining the respective second controllable currents of the segments to produce a second combined signal at said second combined signal terminal;

first shielding means, connected between said first combined signal terminal and said switching means in one or more of said segments, for shielding the switching means in the segment(s) concerned from variations in potential arising from variations in potential of that terminal;

second shielding means, connected between said second combined signal terminal and said switching means in said one or more segments, for shielding the switching means in the segment(s) concerned from variations in potential arising from variations in potential of that terminal; and decoder circuitry connected for receiving a digital input signal to be converted into a corresponding analog output signal, and operable to derive from the received digital input signal a set of said switching signals for application respectively to said segments.

* * * * *